United States Patent
Das et al.

(10) Patent No.: US 7,190,707 B2
(45) Date of Patent: Mar. 13, 2007

(54) GAS DISCHARGE LASER LIGHT SOURCE BEAM DELIVERY UNIT

(75) Inventors: Palash P. Das, Vista, CA (US); Khurshid Ahmed, San Diego, CA (US); Gregory Francis, Escondido, CA (US); Holger Glatzel, San Diego, CA (US); Alexei Lukashev, San Diego, CA (US); Jeremy Tyler, Oceanside, CA (US); R. Kyle Webb, Escondido, CA (US)

(73) Assignee: Cymer, Inc., San Diego, CA (US)

( * ) Notice: Subject to any disclaimer, the term of this patent is extended or adjusted under 35 U.S.C. 154(b) by 208 days.

(21) Appl. No.: 10/739,961

(22) Filed: Dec. 17, 2003

(65) Prior Publication Data

US 2004/0179560 A1 Sep. 16, 2004

Related U.S. Application Data

(63) Continuation-in-part of application No. 10/141,216, filed on May 7, 2002, now Pat. No. 6,693,939, which is a continuation-in-part of application No. 10/036,676, filed on Dec. 21, 2001, now Pat. No. 6,882,674, which is a continuation-in-part of application No. 10/036,727, filed on Dec. 21, 2001, now Pat. No. 6,865,210, which is a continuation-in-part of application No. 10/006,913, filed on Nov. 29, 2001, now Pat. No. 6,535,531, which is a continuation-in-part of application No. 10/000,991, filed on Nov. 14, 2001, now Pat. No. 6,795,474, which is a continuation-in-part of application No. 09/943,343, filed on Aug. 29, 2001, now Pat. No. 6,567,450, which is a continuation-in-part of application No. 09/854,097, filed on May 11, 2001, now Pat. No. 6,757,316, which is a continuation-in-part of application No. 09/848,043, filed on May 3, 2001, now Pat. No. 6,549,551, which is a continuation-in-part of application No. 09/837,150, filed on Apr. 18, 2001, now Pat. No. 6,504,860, which is a continuation-in-part of application No. 09/829,475, filed on Apr. 9, 2001, now Pat. No. 6,765,945, which is a continuation-in-part of application No. 09/771,789, filed on Jan. 29, 2001, now Pat. No. 6,539,042.

(51) Int. Cl.
*H01S 3/22* (2006.01)

(52) U.S. Cl. .......................................... 372/55; 372/15

(58) Field of Classification Search ................ 372/107, 372/108, 55, 61, 25
See application file for complete search history.

(56) References Cited

U.S. PATENT DOCUMENTS

| | | | |
|---|---|---|---|
| 3,516,638 A * | 6/1970 | Piggott ........................ 251/175 |
| 4,223,279 A | 9/1980 | Bradford, Jr. et al. ..... 331/94.5 |
| 4,455,658 A | 6/1984 | Sutter et al. ................... 372/38 |
| 4,959,840 A | 9/1990 | Akins et al. .................... 372/57 |
| 5,023,884 A | 6/1991 | Akins et al. .................... 372/57 |
| 5,025,445 A | 6/1991 | Anderson et al. ............. 372/20 |
| 5,025,446 A | 6/1991 | Kuizenga ...................... 372/21 |
| 5,189,678 A | 2/1993 | Ball et al. ...................... 372/28 |
| 5,313,481 A | 5/1994 | Cook et al. .................... 372/37 |
| 5,315,611 A | 5/1994 | Ball et al. ...................... 372/56 |
| 5,359,620 A | 10/1994 | Akins ............................ 372/58 |
| 5,448,580 A | 9/1995 | Birx et al. ...................... 372/38 |
| 5,471,965 A | 12/1995 | Kapich ........................ 123/565 |
| 5,596,590 A * | 1/1997 | de Ruyter et al. ............ 372/14 |
| 5,852,621 A | 12/1998 | Sandstrom .................... 372/25 |
| 5,863,017 A | 1/1999 | Larson et al. ............. 248/176.1 |
| 5,953,360 A | 9/1999 | Vitruk et al. .................. 372/87 |
| 5,978,394 A | 11/1999 | Newman et al. .............. 372/32 |
| 6,005,879 A | 12/1999 | Sandstrom et al. ........... 372/25 |
| 6,016,325 A | 1/2000 | Ness et al. ..................... 372/38 |
| 6,018,537 A | 1/2000 | Hofmann et al. ............. 372/25 |
| 6,028,880 A | 2/2000 | Carlesi et al. ................. 372/58 |
| 6,067,311 A | 5/2000 | Morton et al. ................. 372/57 |
| 6,094,448 A | 7/2000 | Fomenkov et al. ......... 372/102 |
| 6,104,735 A | 8/2000 | Webb ............................ 372/37 |
| 6,128,323 A | 10/2000 | Myers et al. .................. 372/38 |
| 6,151,349 A | 11/2000 | Gong et al. .................... 372/58 |
| 6,164,116 A | 12/2000 | Rice et al. .................... 73/1.72 |
| 6,176,160 B1 * | 1/2001 | Ruhlander et al. ............ 81/438 |

| | | | | |
|---|---|---|---|---|
| 6,192,064 B1 | 2/2001 | Algots et al. | | 372/99 |
| 6,208,674 B1 | 3/2001 | Webb et al. | | 372/57 |
| 6,208,675 B1 | 3/2001 | Webb | | 372/58 |
| 6,219,368 B1 | 4/2001 | Govorkov | | 372/59 |
| 6,240,117 B1 | 5/2001 | Gong et al. | | 372/58 |
| 6,330,261 B1 | 12/2001 | Ishihara et al. | | 372/38.1 |
| 6,414,979 B2 | 7/2002 | Ujazdowski et al. | | 372/87 |
| 6,477,193 B2 | 11/2002 | Oliver et al. | | 372/58 |
| 6,493,364 B1 | * 12/2002 | Baumler et al. | | 372/15 |
| 6,693,939 B2 | 2/2004 | Klene et al. | | 372/58 |
| 6,704,339 B2 | 3/2004 | Lublin et al. | | 372/57 |
| 6,704,340 B2 | 3/2004 | Ershov et al. | | 372/58 |
| 6,757,316 B2 | 6/2004 | Newman et al. | | 372/57 |
| 6,837,480 B1 | * 1/2005 | Carlson | | 251/209 |
| 2003/0219056 A1 | 11/2003 | Yager et al. | | 372/57 |
| 2004/0022291 A1 | 2/2004 | Das et al. | | 372/55 |

* cited by examiner

*Primary Examiner*—Minsun Oh Harvey
*Assistant Examiner*—Tuan N. Nguyen
(74) *Attorney, Agent, or Firm*—William C. Cray

(57) ABSTRACT

A beam delivery unit and method of delivering a laser beam from a laser light source for excimer or molecular fluorine gas discharge laser systems in the DUV and smaller wavelengths is disclosed, which may comprise: a beam delivery enclosure defining an output laser light pulse beam delivery pat from an output of a gas discharge laser to an input of a working apparatus employing the light contained in the output laser light pulse beam; a purge mechanism operatively connected to the beam delivery enclosure; an in-situ beam parameter monitor and adjustment mechanism within the enclosure, comprising a retractable bean redirecting optic; a beam analysis mechanism external to the enclosure; and, a retraction mechanism within the enclosure and operable from outside the enclosure and operative to move the retractable beam redirecting optic from a retracted position out of the beam path to an operative position in the beam path. The BDU may also include a beam attenuator unit contained within the enclosure adjustably mounted within the enclosure for positioning within the beam delivery pat. The BDU may have at least two enclosure isolation mechanisms comprising a first enclosure isolation mechanism on a first side of the enclosure from the at least one optic module and a second enclosure isolation mechanism on a second side of the enclosure from the at least one optic module, each respective enclosure isolation mechanism comprising a flapper valve having a metal to metal seating mechanism and a locking pin assembly. A precision offset ratchet driver operative to manipulate actuator mechanisms in difficult to reach locations may be provided. An external kinematic alignment tool may be provided. A method of contamination control for a BDU is disclosed comprising selection of allowable materials and fabrication processes.

10 Claims, 12 Drawing Sheets

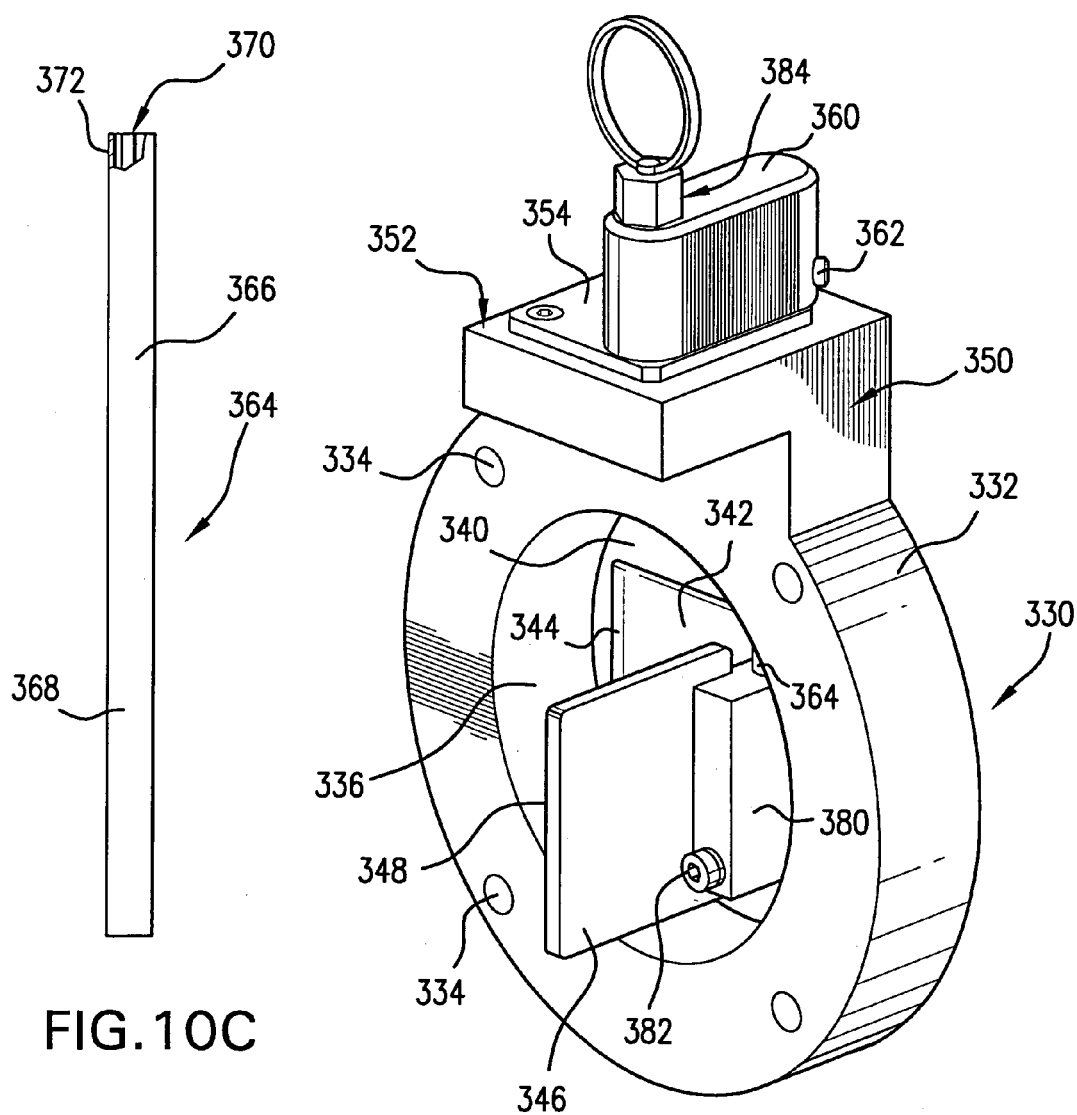

GAS DISCHARGE LASER LIGHT SOURCE BEAM DELIVERY UNIT

RELATED APPLICATIONS

The present application is a continuation-in-part of U.S. Published Patent Application No. US/20020191654A1, entitled LASER LITHOGRAPHY LIGHT SOURCE WITH BEAM DELIVERY, with inventors Klene, et al., published on Dec. 19, 2002, based upon a U.S. application Ser. No. 10/141,216, filed on May 7, 2002; and U.S. Published Patent Application No. US/20030043876A1, entitled LITHOGRAPHY LASER WITH BEAM DELIVERY AND BEAM POINTING CONTROL, with inventors Lublin et al., published on Mar. 6, 2003, based upon a U.S. application Ser. No., 10/233,253 filed on Aug. 30, 2002; and U.S. Patent Published Application No. US/20030091087A1, entitled LITHOGRAPHY LASER SYSTEM WITH IN-PLACE ALIGNMENT TOOL, with inventors Ershov et al., published on May 15, 2003, based upon a U.S. application, Ser. No. 10/255,806, filed on Sep. 25, 2002; and U.S. application Ser. No. 10/384,967, entitled HIGH POWER DEEP ULTRAVIOLET LASER WITH LONG LIFE OPTICS, filed on Mar. 8, 2003, and U.S. application Ser. No. 10/425,361, entitled LITHOGRAPHY LASER WITH BEAM DELIVERY AND BEAM POINTING CONTROL, filed on Jun. 29, 2003, the disclosures of each of which is hereby incorporated by reference.

FIELD OF THE INVENTION

The present invention relates to the field of gas discharge lasers and apparatus and methods for delivering the output laser light pulse beam to a manufacturing tool, e.g., a micro-lithography exposure illumination tool, and monitoring, preserving and modifying beam qualities prior to such delivery.

BACKGROUND OF THE INVENTION

Long optics life is extremely important and extremely difficult to achieve in vacuum ultraviolet light ("VUV") and other deep ultraviolet ("DUV") and extreme ultraviolet ("EUV") applications. Requirements, e.g., of >12 billion pulse optic lifetimes can create an extreme need for contamination control measures, e.g., in the design of beam delivery units ("BDUs"), i.e., methods and apparatus for delivering the output laser light pulse beam to a manufacturing tool, e.g., a micro-lithography exposure illumination tool, and monitoring, preserving and modifying beam qualities prior to such delivery.

Electric discharge gas lasers are well known and have been available since soon after lasers were invented in the 1960s. A high voltage discharge between two electrodes excites a laser gas to produce a gaseous gain medium. A resonance cavity containing the gain medium permits stimulated amplification of light which is then extracted from the cavity in the form of a laser beam. Many of these electric discharge gas lasers are operated in a pulse mode.

Excimer lasers are a particular type of electric discharge gas laser and they have been known since the mid 1970s. A description of an excimer laser, useful for integrated circuit lithography, is described in U.S. Pat. No. 5,023,884 issued Jun. 11, 1991 entitled COMPACT EXCIMER LASER. This patent has been assigned to Applicants' employer, and the patent is hereby incorporated herein by reference. The excimer laser described in U.S. Pat. No. 5,023,884 is a high repetition rate pulse laser.

These excimer lasers, when used for integrated circuit lithography, are typically operated in an integrated circuit fabrication line "around-the-clock" producing many thousands of valuable integrated circuits per hour; therefore, down-time can be very expensive. For this reason most of the components are organized into modules which can be replaced within a few minutes. Excimer lasers used for lithography typically must have its output beam reduced in bandwidth to a fraction of a picometer. This "line-narrowing" is typically accomplished in a line narrowing module (called a "line narrowing package" or "LNP" for KrF and ArF lasers) which forms the back of the laser's resonant cavity (A line selection unit "LSU" is used for selecting a narrow spectral band in the $F_2$ laser). The LNP is comprised of delicate optical elements including prisms, mirrors and a grating. Electric discharge gas lasers of the type described in U.S. Pat. No. 5,023,884 utilize an electric pulse power system to produce the electrical discharges, between the two elongated electrodes. In such prior art systems, a direct current power supply charges a capacitor bank called a "charging capacitor" or "$C_0$" to a predetermined and controlled voltage called the "charging voltage" for each pulse. The magnitude of this charging voltage may be in the range of about 500 to 1000 volts in these prior art units. After $C_0$ has been charged to the predetermined voltage, a solid state switch is closed allowing the electrical energy stored on $C_0$ to ring very quickly through a series of magnetic compression circuits and a voltage transformer to produce high voltage electrical potential in the range of about 16,000 volts (or greater) across the electrodes which produce the discharges which lasts about 20 to 50 ns.

It is important not only to carefully monitor and control parameters of the laser output light pulse beam, but to deliver that light, e.g., to a manufacturing tool, often located across a room or even on a different floor in a manufacturing facility with proper light parameter characteristics which might be altered by the apparatus and method of such delivery, and therefore need monitoring and perhaps even modification as part of the deliver system and method.

A BDU system, e.g., can be a purged gas tight system. Periodically module replacement may be required for various reasons. Exposure to open air is detrimental to optics life, i.e., when the purge environment is breached. It is highly desirable to be able to remove and replace an optics module in the BDU system without contaminating (exposing) other modules to open air while the module is being removed and/or replaced. It is further desirable to be able to do such repair/replacement without then having to repurge the entire BDU.

During, e.g., the fabrication of a BDU, it may become necessary, e.g., to optically align the BDU, including, e.g., its internal modules and/or the input and output ports of the entire BDU with an external alignment methodology. There are occasions where the previous methods of aligning the BDU and/or the BDU modules using a prior, e.g., total station technique may not be feasible, e.g., due to space limitations, i.e., close proximity to other elements of the laser system or surrounding structures or machinery and/or small working areas, e.g., prohibiting open beam alignment.

The BDU system, e.g., when operating at 193 um wavelength can have a hard time achieving optics element/module long lifetimes, e.g., due to the effects of contamination on the optics. One of the biggest problems confronted by the BDU system design can be, e.g., in-situ beam alignment. In-situ, open beam alignment, e.g., can be very detrimental to optics life.

Some lasers, e.g., XLA lasers may have uneven spatial coherence, which is a problem that needs to be corrected.

Long optic life can be extremely important in DUV, VUV and EUV light source and delivery systems, including e.g., excimer or molecular fluorine gas discharge lasers with associated beam delivery units. Requirements for lives exceeding 12 B pulses can create extreme need for contamination prevention, detection and control measures in the design, e.g., of the BDU in order to achieve the lifetime requirements.

SUMMARY OF THE INVENTION

A beam delivery unit and method of delivering a laser beam from a laser light source for excimer or molecular fluorine gas discharge laser systems in the DUV and smaller wavelengths is disclosed, which may comprise: a beam delivery enclosure defining an output laser light pulse beam delivery path from an output of a gas discharge laser to an input of a working apparatus employing the light contained in the output laser light pulse beam; a purge mechanism operatively connected to the beam delivery enclosure; an in-situ beam parameter monitor and adjustment mechanism within the enclosure, comprising a retractable beam redirecting optic; a beam analysis mechanism external to the enclosure; and, a retraction mechanism within the enclosure and operable from outside the enclosure and operative to move the retractable beam redirecting optic from a retracted position out of the beam path to an operative position in the beam path. The BDU may also include a beam attenuator unit contained within the enclosure adjustably mounted within the enclosure for positioning within the beam delivery path. The BDU may have at least two enclosure isolation mechanisms comprising a first enclosure isolation mechanism on a first side of the enclosure from the at least one optic module and a second enclosure isolation mechanism on a second side of the enclosure from the at least one optic module, each respective enclosure isolation mechanism comprising a flapper valve having a metal to metal seating mechanism and a locking pin assembly. A precision offset ratchet driver operative to manipulate actuator mechanisms in difficult to reach locations may be provided. An external kinematic alignment tool may be provided. A method of contamination control for a BDU is disclosed comprising selection of allowable materials and fabrication processes.

DETAILED DESCRIPTION OF PREFERRED EMBODIMENTS

An aspect of an embodiment of the present invention establishes, e.g., proven materials, design configurations, and cleaning processes that when implemented result in achieving required optic lifetimes, e.g., on the order of >12 billion pulses. Optic lifetimes are measured, e.g., in terms of some % of transmission loss. Transmission loss of less than 1% over 12 billion pulses is accomplished according to aspects of an embodiment of the present invention.

According to another aspect of an embodiment of the present invention there is provided, e.g., a method and apparatus for in-situ optics module replacement without open air contamination of the rest of the BDU system. The module can, e.g., be used wherever necessary to control contamination to the BDU due to potential module repair/ maintenance/replacement.

According to aspects of another embodiment of the present invention beam alignment, power measurements, and beam analysis can be provided without exposure to the atmosphere. Being able to, e.g., perform optical alignment or to perform beam analysis and power measurements without exposing the optics can, e.g., significantly enhance optics lifetime.

Figure 1:
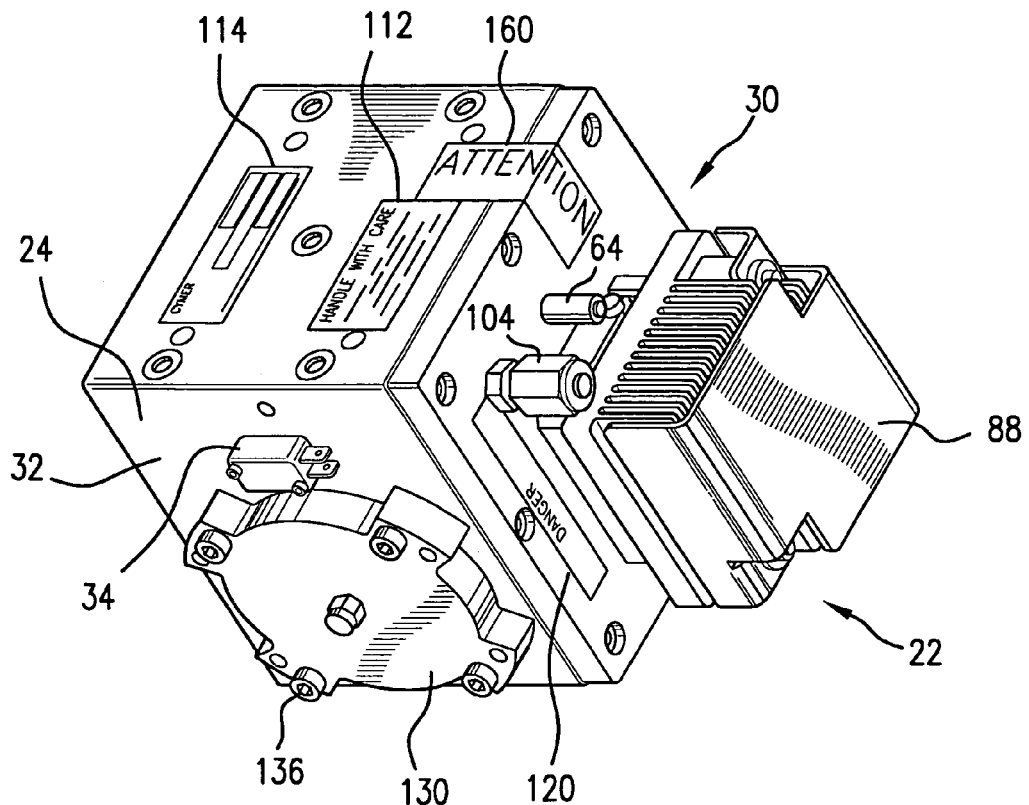
FIG. 1 shows a perspective view of an aspect of an embodiment of the present invention.

Turning now to FIG. 1 a perspective view of an embodiment of the present invention is shown to include a beam delivery unit 20 (shown in FIG. 4) beam alignment and inspection unit 22. The alignment unit 22 may include, e.g., a beam cover 30 including a housing 32. Mounted on the housing 32 may be, e.g., a light trap assembly 88.

Figure 3A:
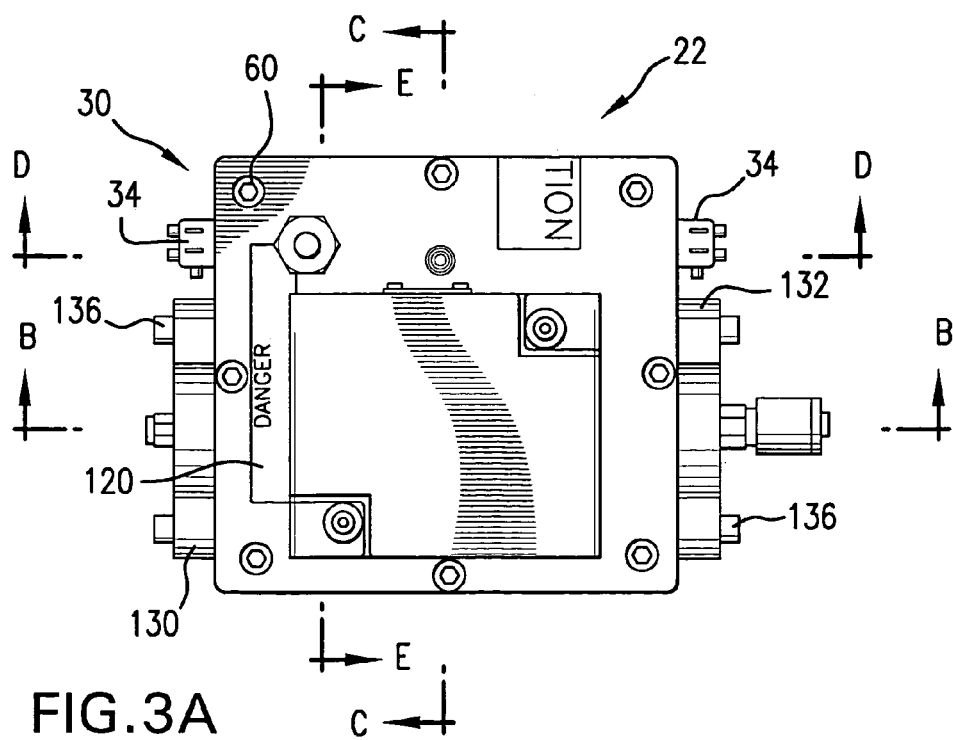
FIG. 3A shows a side view of the embodiment of the present invention shown in FIG. 1.
Figure 2:
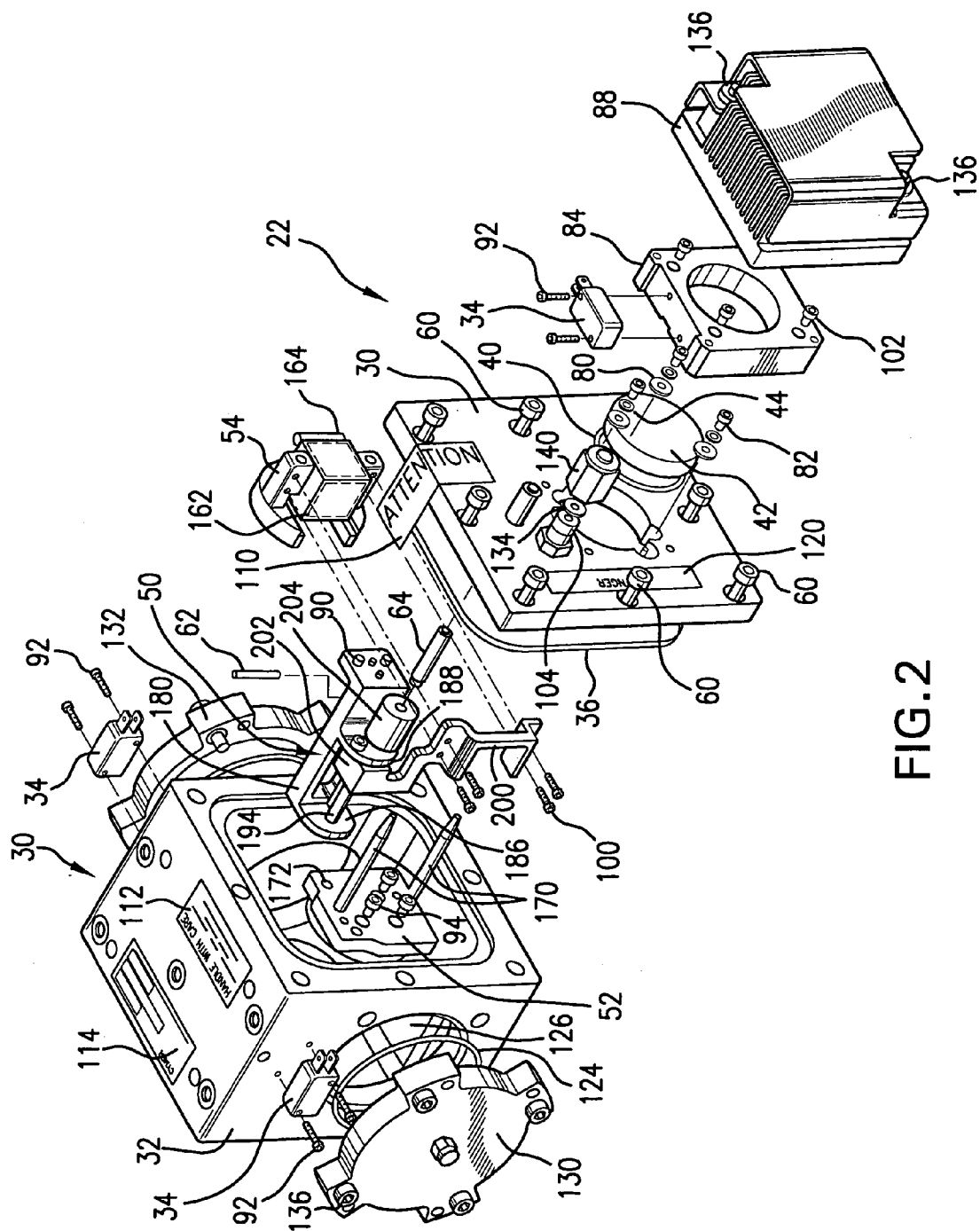
FIG. 2 shows an exploded view of the embodiment of the present invention shown in FIG. 1.

Turning now to FIG. 2 there is shown an exploded view of the beam alignment unit 22. FIG. 3A shows a side view of the embodiment of the invention shown in FIGS. 1 and 2. FIGS. 3B–E show a cross-sectional views of the beam alignment and inspection assembly 22 along the cross-sectional lines A—A, B—B, C—C, D—D and E—E shown in FIG. 3A.

Referring to FIGS. 1–3E it can be seen that the beam alignment and inspection unit 22 may have a pair of microswitches 34 mounted on the housing 32, e.g., by a pair of M2.5–0.45×16 mm socket head cap screws 92, which respective micro-switch 34 can be used, e.g., to indicate that a beam delivery unit 20 beam enclosure section (not shown in FIGS. 1–3E connection flange (not shown) is connected to the respective side of the housing 32. The unit 22 may also include, e.g., an external pressure 180° 5.002" square× 0.093" high c-seal 36 providing a sealing connection between the beam cover 30 and the housing 32. The unit 22 may also include, e.g., an indium gasket 40 having, e.g., a 49.25 mm inner diameter and a 0.265 mm thickness for providing a seal between a, e.g., 50.8 mm diameter by 9.53 mm thick flat optical window 42, e.g., designed for 193 nm light and being made, e.g., of fused silica. The flat 42 may be held in place by a plurality of washer clips 80 connected to the cover plate 30, e.g., by respective M3–0.5×4 mm socket head cap screws 82 and M3 split lock washers 80.

The flat window 42 may also be covered by a window cover 84, which may be attached to the beam cover 30 by a plurality of M4–0.7×8 mm socket head cap screws. This entire assembly may be, e.g., enclosed within the light trap assembly 88 attached to the beam cover 30 by, e.g., a plurality of M6–1×20 mm socket head cap screws 136. Also attached to the window cover 84 may be a micro-switch 34 that can serve, e.g., to provide, e.g., interlock protection, e.g., to indicate a beam open condition. For example, the microswitch 34 may be positioned such that when an adjacent fixture, e.g., a beam enclosure tube, is placed in position, e.g., where the beam opening cover 136 is in FIG. 1, the normally open spring loaded trip switch (not shown) that is part of the micro-switch 34 is moved to the shut position, e.g., by contacting the beam enclosure tube. If the beam enclosure tube is thereafter removed, the micro-switch can open under the spring bias, and be used in a control system, e.g., to prevent laser firing with the potential open beam condition indicated. Also mounted on the beam cover 30 may be a vacuum connection 104 having, e.g., a cover 140 and a VCR gasket retainer assembly 134. The beam cover 30 may be attached to the housing 32 by a plurality of M6–1×20 mm socket head cap screws 60.

The housing may have a first and second beam passage opening 126 and 128, each of which may be covered for shipment by a respective input port and output port inspection shipping cover 130, 132, each of which may be sealed by, e.g., an inconel 180°3.131 outer diameter ×2.905 inner diameter 718, tin coated external pressure c-seal 124. In normal operation, the laser output beam transiting the beam delivery unit 20 may pass through the openings 126, 128.

Contained within the unit 22 may be a plurality of assemblies, e.g., a beam energy alignment actuator assembly 50, an alignment tool inspection interface mounting assembly 52 and a beam energy alignment prism mount assembly 54.

The alignment tool interface assembly mount 52 may include, e.g., a pair of alignment tool alignment shafts 170 which may be, e.g., press fitted into openings in the assembly mount 52. The assembly mount may be attached to the interior wall of the housing 32 by a plurality of M4–0.7×8 mm vented/plshd (polished) socket head cap screws 94. A plurality of dowel pins 172 may be used to hold in place in openings in the mount assembly 52 a respective one of a plurality of magnets 174.

The beam energy alignment prism mount assembly 54 may include a total internal reflectance right angle prism 160, which may be, e.g., 30 mm×30 mm excimer grade fused silica. The prism 160 may be held in place on a 45° angled prism shelf 166 by a spring clip optical mount 162, which may be attached to the mount assembly 54 by a plurality of vented/polished M2–0.4×4 mm socket head cap screws 162. The spring clips, as shown in FIG. 3E can extend over a respective corner of the prism 160 to hold the prism 160 in place. Spherical balls 176 forming hemispherical protrusions from the mount assembly 54 may interface with the magnets 174.

The beam energy alignment actuator assembly 50 may include, e.g., an actuator assembly L-bracket 180, which may, e.g., be attached to the inner wall of the beam cover 30 by a pair of vented/plshd M4–0.7×10 mm socket head cap screws 90 also formed as a part of the L-Bracket may be lead screw inner shelf 186 and a lead screw outer shelf 188. Each of the inner shelf 186 and outer shelf 188 may have contained therein a respective unshielded radial ball bearing 182 each held in place in the respective shelf 186, 188 by a respective bearing clamp 190, each of which may be held in place, e.g., by a plurality of vented/plshd M3–0.5×5 mm socket head cap screws 192. A lead screw 194 may pass through each respective ball bearing 182 and be held in place for rotational movement about the longitudinal axis of the lead screw 194 by an inner and an outer retaining ring 196.

Also attached to the actuator assembly 50 may be, e.g., a beam translator carrier 200 which may have a bracket portion to which is attached the prism assembly 54 by a plurality of M3–0.5 4 mm D×6 mm socket head cap screws 100 and a traveling member 202 threadedly engaging the lead screw 194. Also guiding the movement of the translator member 200 can be, e.g., a shaft 134 which also passes through an opening in the traveling member 202.

The lead screw may be attached through an opening in the beam cover 32 to an external actuator screw 64 which may be connected to one end of a helical flex coupling 204, which may be attached at each end respectively to the external actuator screw 64 and the lead screw by a respective vented/plshd M3–0.5×16 mm socket head cap screw 206.

Figure 3B:
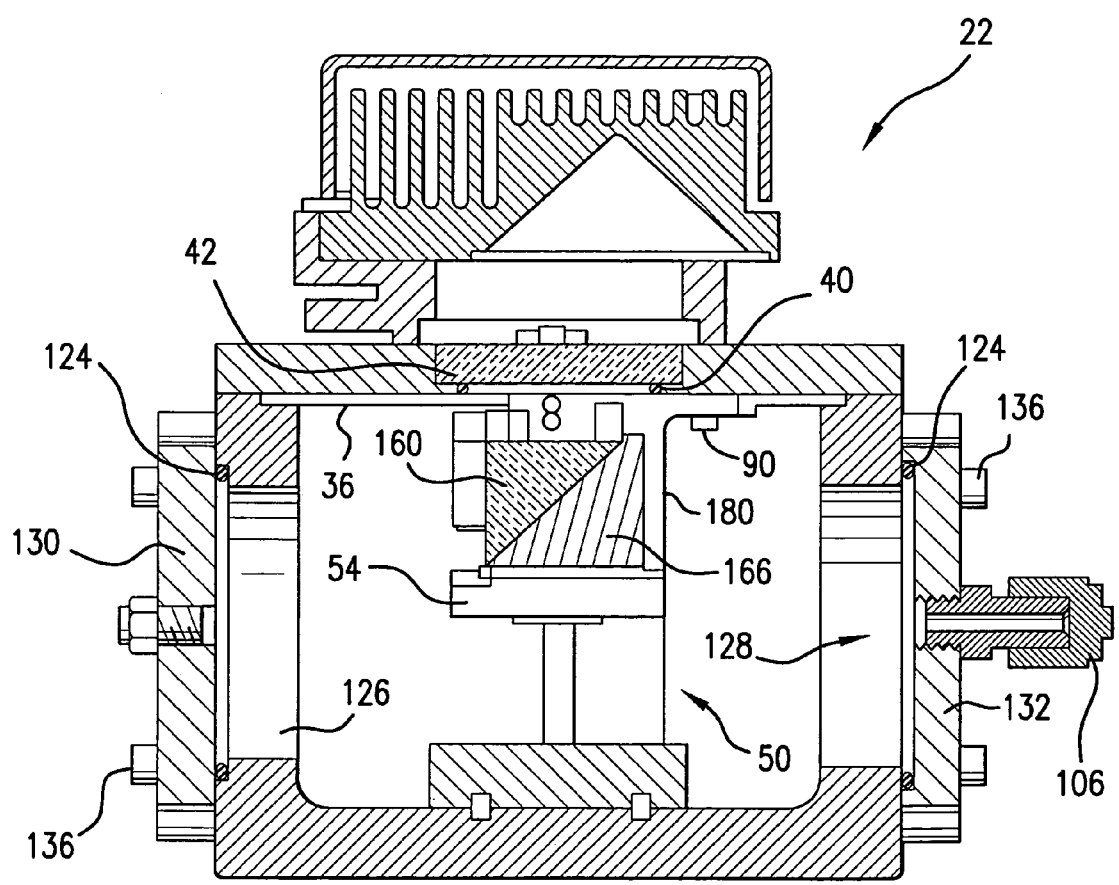
FIGS. 3B–E show cross-sectional views of the embodiment of FIGS. 1–3A taken along the cross-sectional lines B—B, C—C, D—D and E—E of FIG. 3A.
Figure 3C:
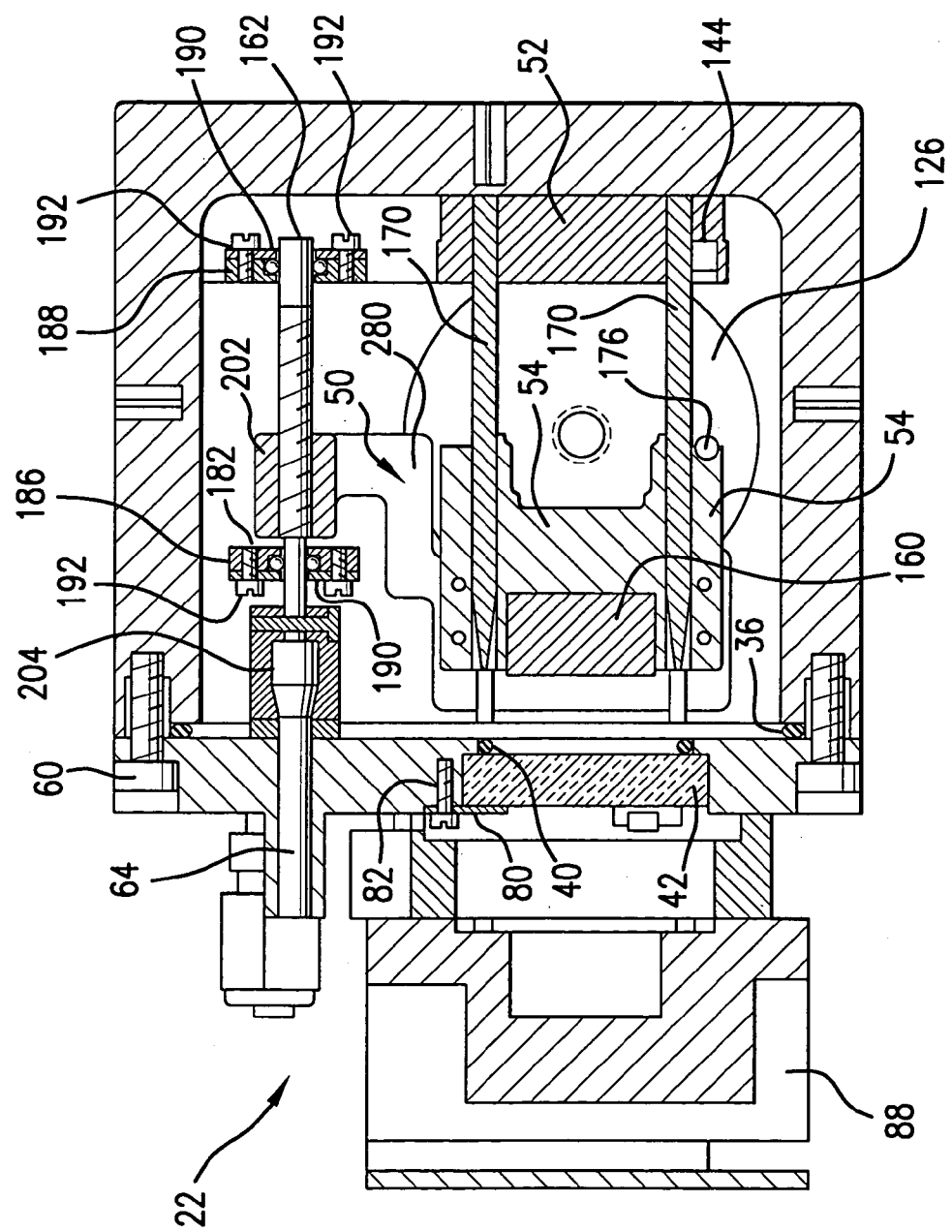
Figure 3D:
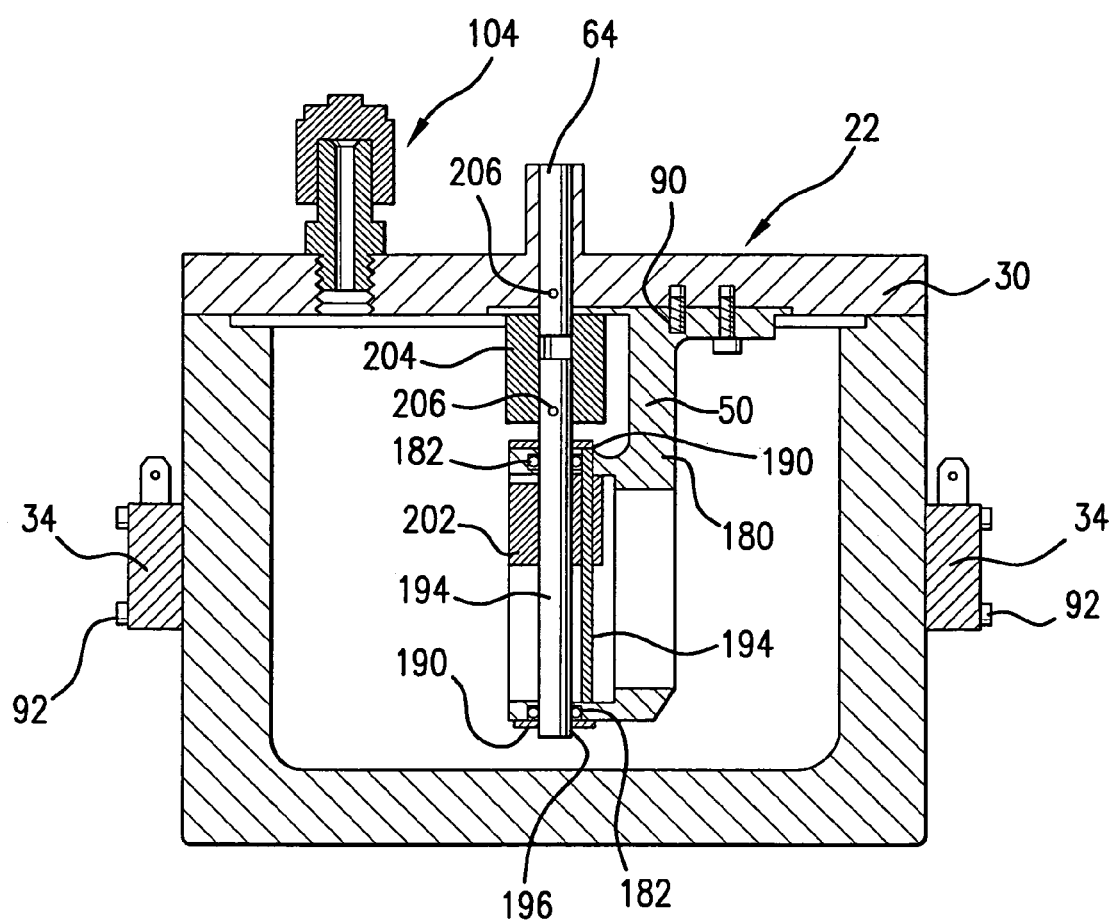
Figure 3E:
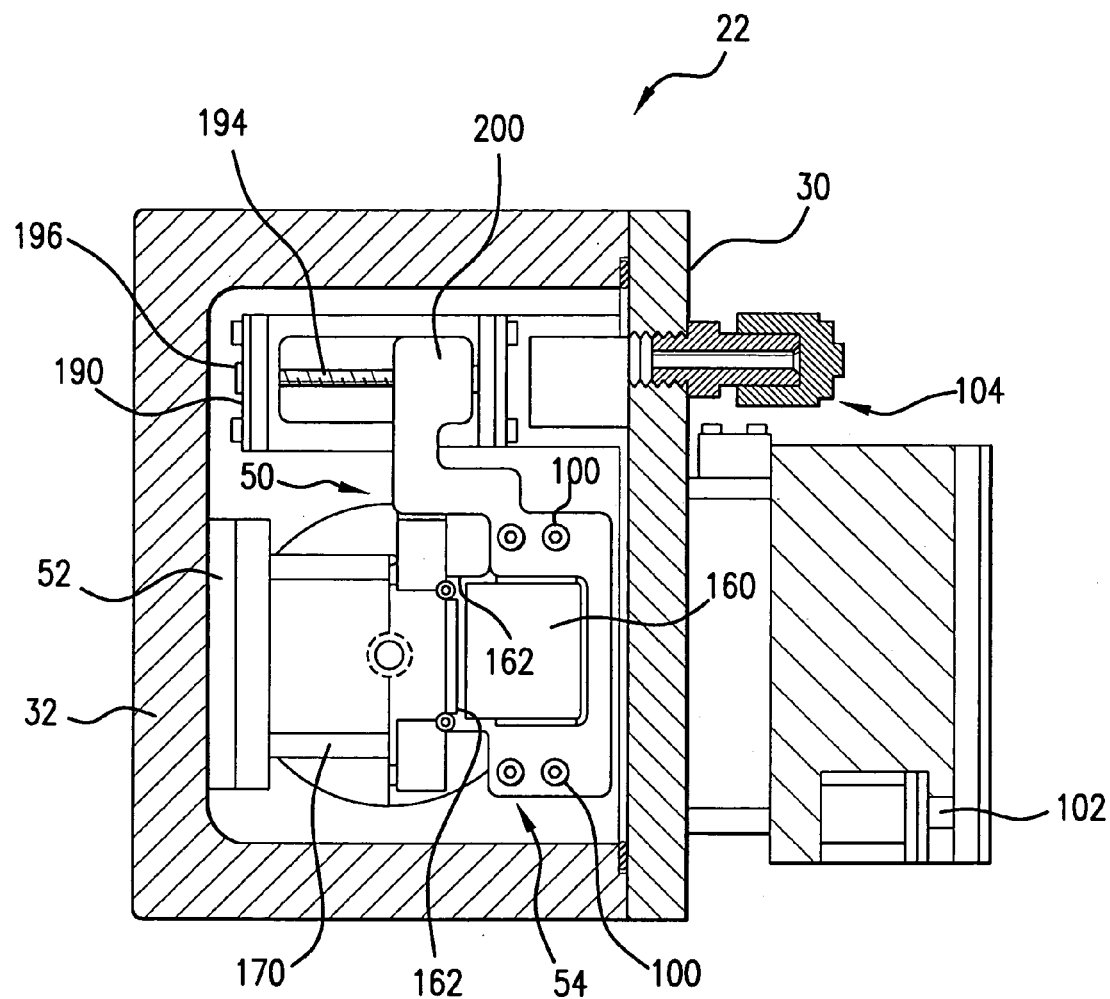

In operation it can be seen that the external actuator screw may be operated to move the beam translator carrier 200 and the attached prism assembly 54, e.g., toward the inner shelf 186, e.g., to position the prism 160 toward the right as shown in FIG. 3C, positioning the prism in the path of the beam the center of which is in the cross-hairs shown in FIG. 3G. This then reflects the beam into the light trap assembly 86 through the window 42. In the light trap assembly 86, a first reflective surface 87 reflects the light to a second reflective surface 88, absorbing, e.g., 40% of the light intensity in the process, and the second reflective surface 88 reflects the light to an exit window 89, absorbing, e.g., 40% of the remaining light intensity in the process and the exit window may also absorb, e.g., 405 or the remaining light as it exits the light trap assembly 86.

It will also be understood that moving the prism 160 in the opposite direction leaves an opening for the beam path, through the opening between the alignment shafts 170 and the opening in the assembly 54, as shown in FIG. 3C, between the input port 126 and the output port 128. It will also be understood that the shipping covers 130 and 132 are removed after shipping and the unit 22 is attached to adjacent sections of the beam delivery unit with the inlet port 126 and outlet port 128 open to allow the laser output beam to pass into and out of the unit 22 as desired during operation or to be deflected for measurement/alignment of the beam.

Figure 4:
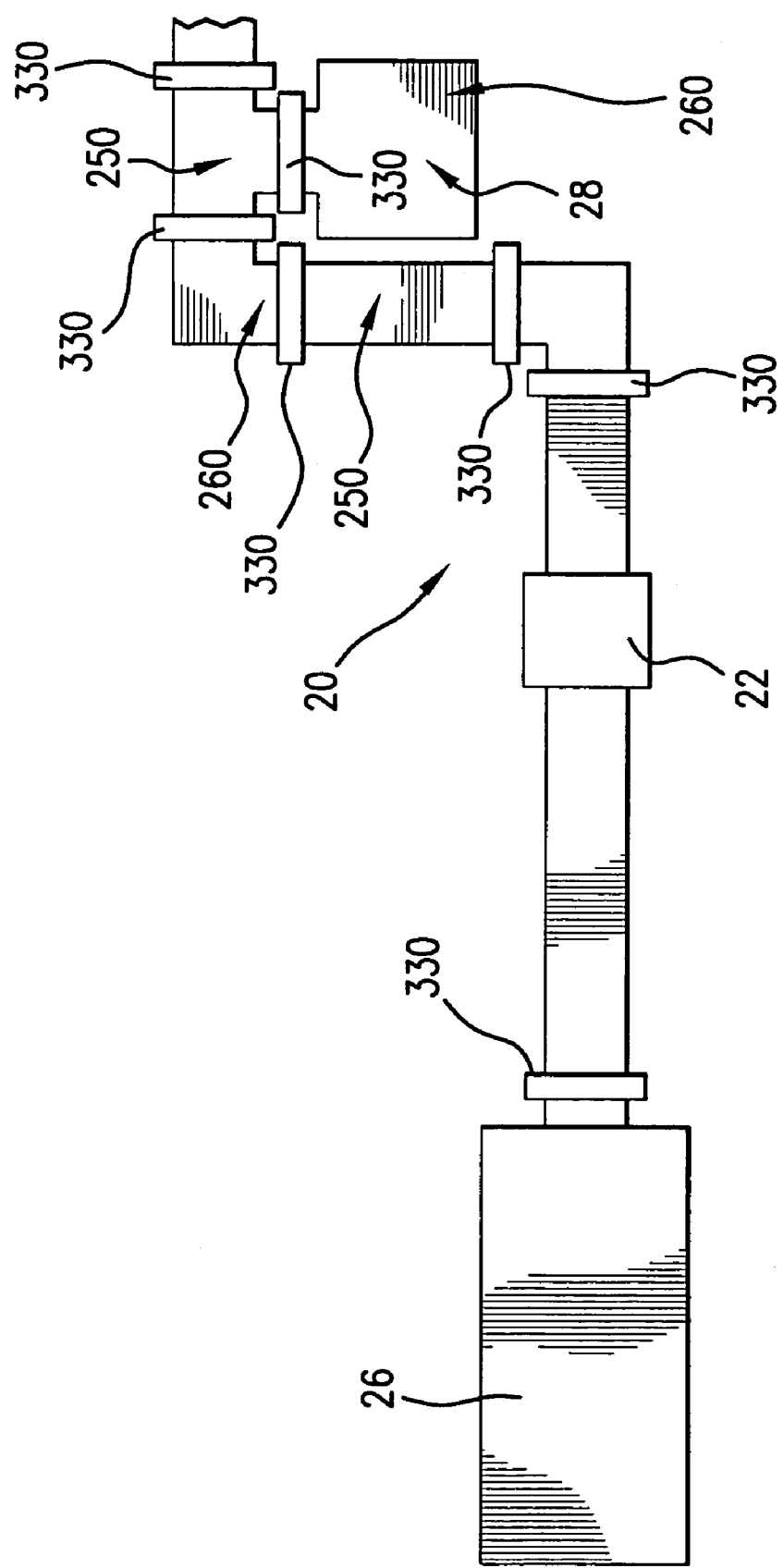
FIG. 4 shows a schematic view of an exemplary beam delivery unit according to an aspect of an embodiment of the present invention.
Figure 5:
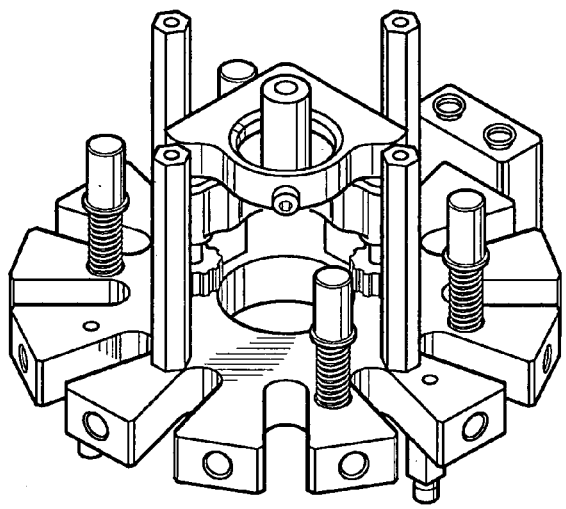
FIGS. 5–7 show external kinematic alignment tool ("EKAT") according to an aspect of an embodiment of the present invention.
Figure 6:
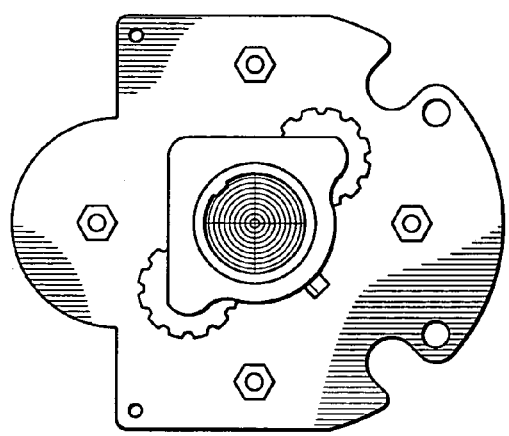
Figure 7:
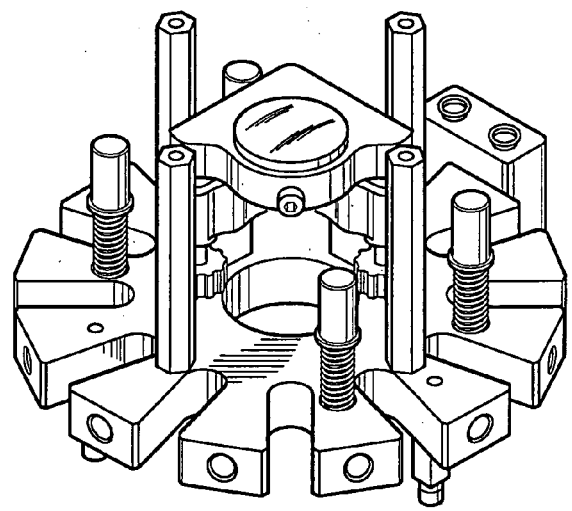

Turning Now to FIGS. 5–7, there is shown an external kinematic alignment tool ("EKAT") 252, which may include EKAT-Laser diode 254. The EKAT 252 may e.g., be mounted to the input of a $1^{st}$ module 250, 250' of a BDU 20, or, e.g., to the output port 128 of an alignment and measurement unit 22 shown in FIGS. 1–3E, or between modules as shown in FIG. 4. With the EKAT laser diode 254 attached, e.g., to the output side of a $1^{st}$ module, an EKAT-alignment target 256, can, e.g., be mounted to the input of a $2^{nd}$ recipient module 260, 260' of the BDU 20, e.g., shown also in FIG. 4, usually the next BDU module 260 in line, and, e.g., the BDU module 260 can then be adjusted in the X,Y and Z directions until the alignment target 256 is centered to the laser beam of the EKAT-Laser diode 254. With the EKAT laser diode 254 attached to the output side of the $1^{st}$ module 250, a small pinhole aperture (not shown) can, e.g., be attached, e.g., to minimize the spot size. An EKAT-reflective mirror 270, e.g., as shown in FIGS. 5 and 6 can, e.g., be attached to the recipient BDU module 250, usually the BDU module next module in line, as noted above, and can be, e.g., rotated about each axis ($\theta X$, $\theta Y$, $\theta Z$) to ensure that the laser beam is reflected upon itself. The recipient module 260 can be leveled to gravity, e.g., using a precision level.

Such a mounting may consist of, e.g., a mounting plate 264, which may, e.g., be adapted to fit over a module cover plate 210, e.g., with radial openings 266 to receive fittings on the module 250, e.g., cover plate set screws 212, when the mounting plate is attached to the module cover plate 210, e.g., by spring loaded attachment screws 263, which may, e.g., threadedly engage threaded openings 265, e.g., on the module cover plate 210. Guide posts 266 may, e.g., extend from one side of the mounting plate 264 and have spherical feet 267, which may engage openings 214 in the side wall 216 of the module housing 250, having, e.g., guide magnets that insure proper positioning of the spherical feet 267. Separators 268 may also be provided.

The mounting plate 264 may also have, e.g., a plurality of mounting posts 270 to which may be attached an instrument platform 272. The instrument platform 272 may have a moveable portion 274 which may be attached to the instrument platform by a pivot pin 275, and a pair of adjustment screws 276 and spring biased against the motion created by the adjustment screws 276 by springs 277.

In operation an instrument, e.g., the laser diode 252, or a target (not shown) of a mirror 270 can be placed in the moveable portion 274 and fixed using the set screw 279, such that, e.g., the laser diode 252 and be aimed at an adjacent module, e.g., 260, e.g., before the enclosure between modules is in place, e.g., to align the adjacent modules 250, 260 before putting the enclosure in place. This could be done with a target in the moveable portion of one module and a laser beam from the laser diode, e.g., in a position, e.g., as shown in FIGS. 5–7 on an opposite side of a module housing 250, and, e.g., a mirror on an adjacent module 260 housing, with, e.g., the laser diode bean traveling through the target (not shown) and reflecting off of a mirror in the moveable portion f an adjacent module 260 having an instrument platform on its respective mounting plate and the reflected beam also striking the target on the module 250. The module 250 or 260 may be fixed and not moveable in the system and the other module may be moveable until, e.g., the reflected beam is moved to the center of the target, indicating that the two adjacent modules are aligned. Alternatively, the laser diode may be mounted on a module 250 mounting plate moveable portion 274 and the module 250 aligned to another module by aligning the beam to a target on another adjacent module.

It will be understood, that in normal operation, the mounting plate 264 and the position of the moveable portion 274 on the instrument platform 272 may be established, e.g., in a perfectly normal relationship, e.g., by using a known calibration jig (not shown) before the mounting plate 264 is used on a module housing 250 for alignment with, e.g., another module housing 260. That is, once the moveable portion 274 is properly aligned using the calibration jig and attached to a module, e.g., 250 for alignment with another module, e.g., 260, it is the respective modules that are moved (normally one will be fixed in the system and not moveable) to effect the desired target alignment, giving the indication that the modules are then properly aligned. The spacers can, then, serve to protect the instrument platform from contacting other objects causing the jig established alignment of the mounting plate 264 and moveable portion 274 to get out of the established alignment during use.

In some cases, e.g., with applicants' assignee's MOPA laser systems, e.g., the XLA series, e.g., there can be an excess of light energy, e.g., early in the life for the system, which can, in fact, actually be detrimental to overall efficiency of the system, e.g., by causing shorter lifetimes, e.g., of certain optical elements, which, therefore, must then be replaced more often. With increasing pulse count the system can, e.g., lose efficiency in other ways, e.g., by causing decreasing transmission of certain optical elements/modules, and or, metrology units, etc. The output power of such systems could, e.g., be kept constant at some level of power output, e.g., by increasing the chamber voltage, however, at some point the voltage reaches a maximum. For this and like reasons modules will need to be replaced.

Figure 8:
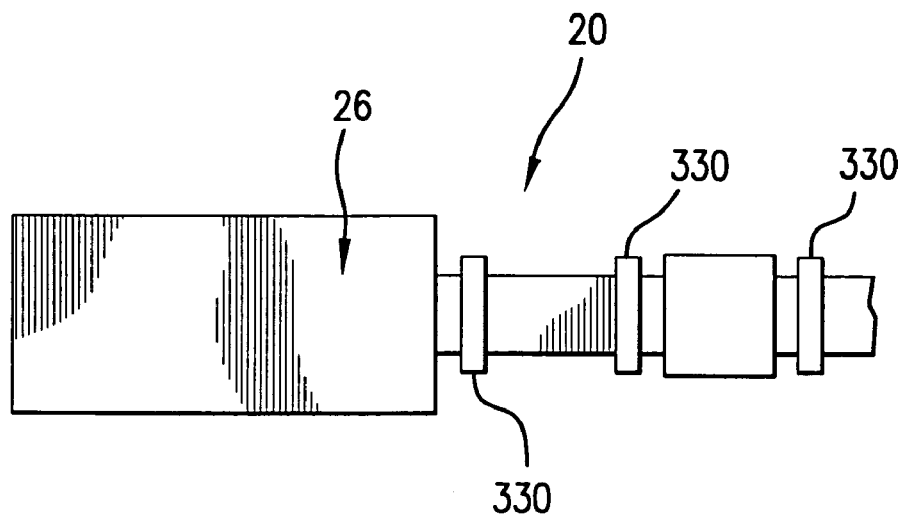
FIG. 8 shows an aspect of an embodiment of the present invention wherein, e.g., an attenuator can be provided that can, e.g., be moved out of the beam path.

Turning now to FIG. 8 there is shown an embodiment of the present invention wherein, e.g., an attenuator 280 can be provided that can, e.g., be moved out of the beam path. While in the beam path however, the attenuator 280 could, e.g., substantially increase the efficiency of the system, e.g., by about 20% or more later in lifetime, thereby extending module lifetimes and decreasing the overall cost of operation. The attenuator can be, e.g., a beam splitter (BS) 282 located upstream of a beam expander, e.g., mounted in a beam analysis module ("BAM") 28, shown in FIG. 4. The beam splitter can, e.g., divert a portion of the beam to a beam dump 284. This BS could consist, e.g., of a thin uncoated CaF2 flat partially reflecting mirror. The two surface Fresnel reflections of such a mirror could, e.g., divert a portion of the beam into the beam dump 284. It will be understood that the beam splitter 282 partially reflecting mirror could be, e.g., substituted for the prism in the embodiment of FIGS. 1–3E and the beam light trap assembly 88 constitute the beam dump 284 of the present embodiment.

The attenuation efficiency can be controlled, e.g., by the angle of incidence of the laser output bean transversing the BDU 20 on the partially reflecting mirror. According to aspects of this embodiment of the present invention, e.g., when the laser reaches its end of life, with the attenuator 280 in place, the beam splitter 282, e.g., can be removed, e.g., during a regular field service by removing the covers and removing the entire beam splitter 282 subassembly. Alternatively the BS could be mounted as shown, e.g., in FIGS. 1–3E on a translator mechanism, which can be moved in and out of the beam path without breaking the seal integrity of the BDU. The technique/mechanical design used for the alignment tool, discussed above, may, e.g., be used to move the attenuator in and out of the beam. Moving an optical flat out of the beam path could produce, e.g., a small beam shift. This beam shift can be compensated for, e.g., by a translational move of the beam expander plate, which can be, e.g., located just downstream of the attenuator 280. The dynamic range of the kinematic beam expander mount could cover the motion needed. It may be very important to maintain absolute alignment of the modules and enclosure tubes and their relationship to true horizontal and vertical, e.g., to maintain beam profiles and shapes, which may not be otherwise maintainable, even if, e.g., alignment of the BDU reflecting mirrors keeps the beam on some beam path through the BDU.

One solution to poor spatial coherence can be, e.g., to reduce spatial coherence of a laser beam by mixing parts of the laser beam. Usually a laser beam has higher intensity in the center and lower intensity at the outer edge. When used properly the suggested approach according to aspects of an embodiment of the present invention can, e.g., homogenize a laser beam, e.g., to make the difference between the center and periphery smaller.

Figure 9:
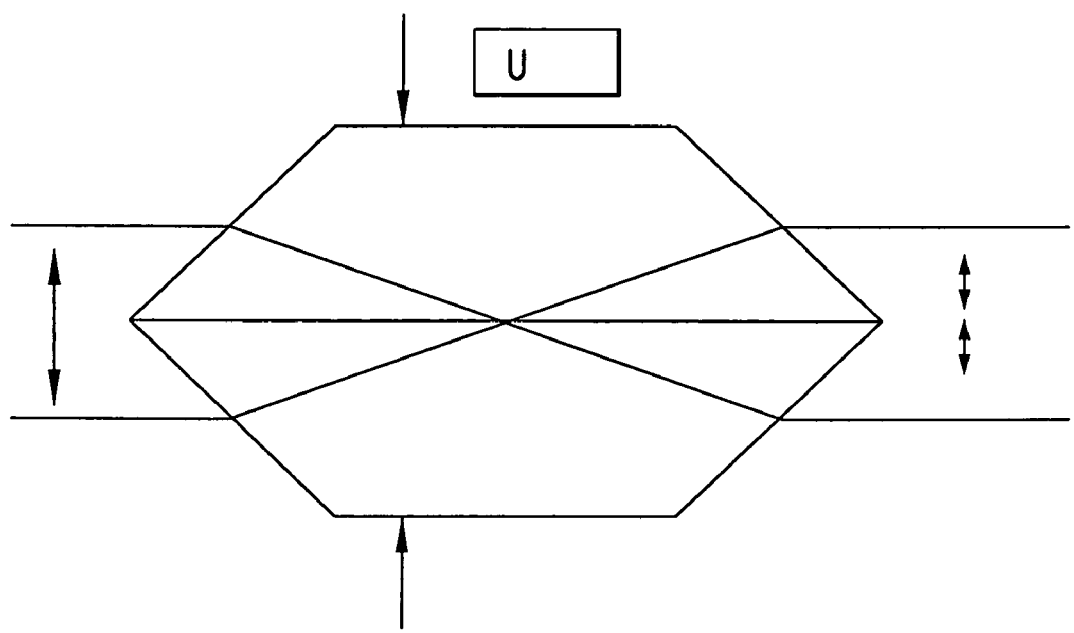
FIG. 9 shows an aspect of an embodiment of the present invention including a beam homoginizer.

Turning now to FIG. 9 there is shown a homoginizer 300, which may include, e.g., two prisms, e.g., two dove prisms 302a, 302b, known also as beam reversion prisms, attached to each other on the bases 304a, 304b. The beam 306, one half of which, 306a goes through the first dove prism 302a and one half of which goes through the second dove prism 3o2b, in going into the respective prism 302a, 302b, can be, e.g., totally internal reflected ("TIR") from the respective base 304a, 304.

The application of, e.g., some pressure to the environment containing the prisms 302a, 302b, can, e.g., spoil or frustrate the TIR, e.g., producing an effect known as frustrated total internal reflection ("FTIR"). By varying the applied pressure it is possible to change the total internal reflection across a range of from 100% TIR to 0% (total optical contact). The common edge 310 of the two prisms 302a, 302b, can, e.g., be aligned with the beam centerline axis, 312. In case 100% TIR reflection, the two parts of the beam will be reversed, i.e., including the respective intensity distributions, e.g., as shown in FIG. 9. In case of 0% reflection the two parts of the beam will be exchanged between each other with no change of intensity distribution. In case of 50% reflection one part of the beam will be mixed with a reversed other part of the beam. The intensity distribution can, e.g., be homogenized and spatial coherence decreased, because of the mixing up of the different parts of the beam. The applied pressure could be applied and controlled, e.g., through the electrical field, e.g., using a piezoelectric actuator (not shown). In operation therefore, with the two prisms attached to each other and FTIR used to control the optical coupling level between two prisms it is possible, e.g., to obtain the best homogenizing, e.g., by controlling the parts of the beam that are mixed, as opposed to the beam as whole, e.g., as shown in FIG. 9B. It will be understood that static or dynamic control is contemplated.

It is also an aspect of an embodiment of the present invention to provide for modular contamination control, e.g., in order to replace/maintain, e.g., optical/metrology elements in a BDU without contaminating the entire BDU. This can be done using shutter arrangements disclosed in the co-pending prior application Ser. Nos. 10/384,967 and 10/425,361, respectively, respectively on Mar. 8, 2003 and Apr. 29, 2003, and assigned to the common assigned of the present application, the disclosures of which are hereby incorporated by reference. Such a shutter arrangement can be as described in more detail below.

Figure 10B:
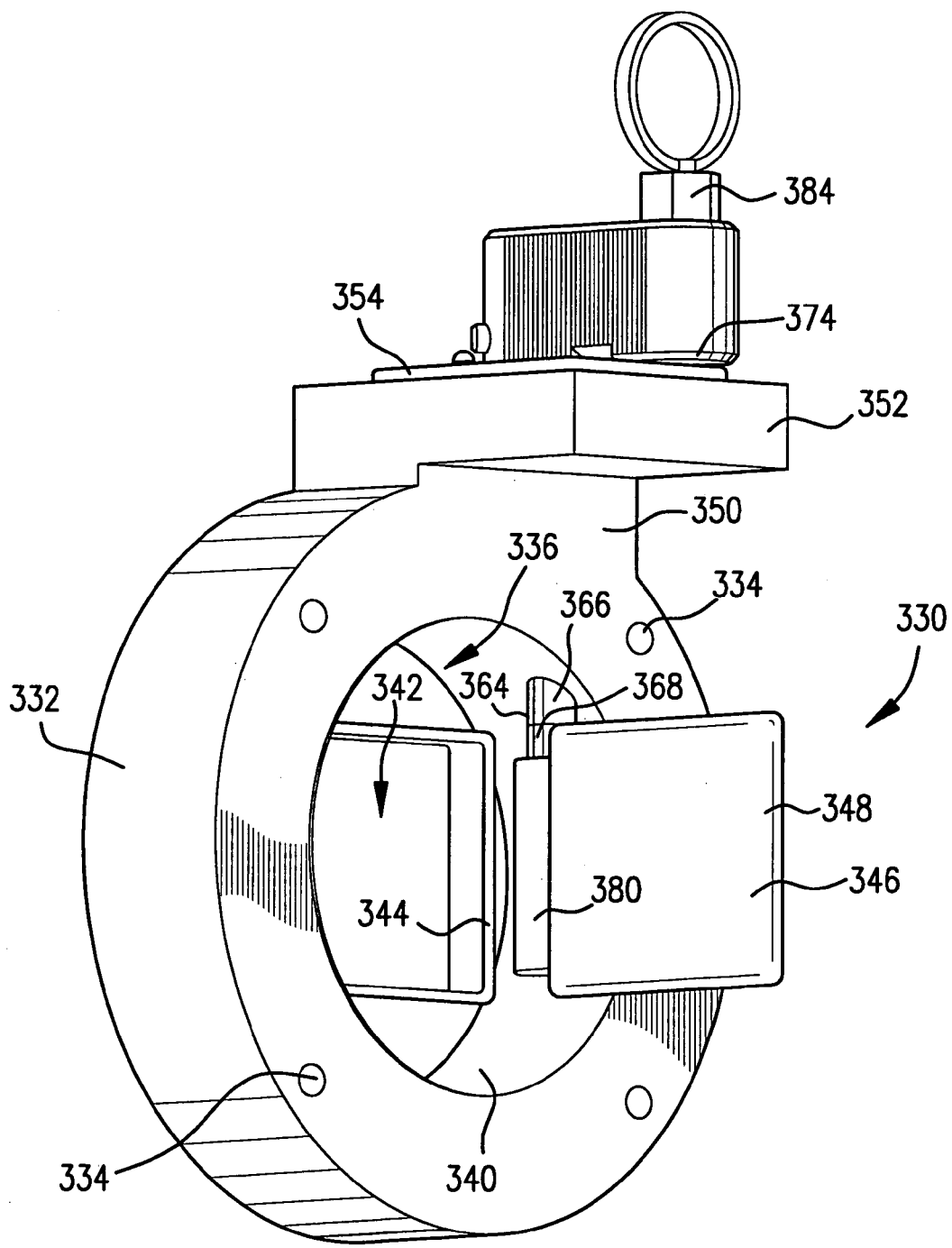
FIGS. 10A and B show a shutter unit according to an aspect of an embodiment of the present invention.
FIG. 10C shows a shutter pivot pin according to an aspect of an embodiment of the present invention.

A shutter unit 330, e.g., as shown in FIGS. 10A and B, may be included in a BDU 20, e.g., on opposite sides of the BDU enclosure from an optical/metrology unit. The shutter 330 may include, e.g., a shutter body 332, which may conform generally to the shape of the adjacent BDU module, e.g., having a generally circular shape, with a plurality of openings 334, through which, e.g., attachment bolts may extend to, e.g., attach the shutter unit 330 to a module housing and/or to a beam enclosure tube. The shutter assembly body 332 may have a shutter recess 336. within the shutter recess 336 may be, e.g., a shutter plate 340 having, e.g., an opening 342. The shutter opening 342 may be of any selected shape, e.g., rectilinear, e.g., generally square. The shutter opening 342 may have a reverse beveled edge 344 around its periphery.

The shutter 346 may be of the same size and shape to mate with the shutter opening 342 and have a beveled edge 348 around its periphery which can serve, e.g., to seat the shutter 346 to the shutter opening 342 when the shutter 346 is shut.

The shutter body 332 may have an actuator flange 350 to which may be attached or integrally formed an actuator shelf 352. An actuator mounting plate 354 may be attached to the actuator shelf 352. An actuator in the form of a shutter flip knob 360 may be attached, e.g., by a pair of set screws 362 to a shutter pivot pin 364. The shutter pivot pin 364 may have, e.g., a wider diameter portion 366 and a smaller diameter portion 368, as shown in FIG. 10C.

The wider diameter portion may extend into an opening in the flip knob 360 and be engaged by the set screws 362. The wider diameter portion 366 may also have an opening 370 at the upper end thereof with a fitting 372, e.g., an allen wrench fitting, for adjusting the shut position of the shutter 346 in relation to the position of the flip knob 360 in a shut position of the flip knob 360.

The shutter may have shutter plate 380 having an opening therethrough (not shown) to receive the narrower diameter portion 368 of the shutter pivot pin 364, which may be held in place with respect to the shutter plate 380, e.g., by a set screw 382.

The actuator mounting plate 354 may have a first locking hole (not shown) aligned with a detent 374 on the end of a spring loaded locking pin 384 when in an open position of the shutter 346, as shown in FIGS. 10A and B, and in a second locking hole (not shown) when in a shut position of the shutter 346.

In operation the shutter 346 may normally be in the open position as illustrated in FIGS. 10A and B when desired, e.g., to isolate an adjacent BDU module, including, e.g., a beam enclosure transit portion, e.g., 250, 250' shown in FIG. 4, an optical module, e.g., 260 shown in FIG. 4, or a metrology module, e.g., BAM 28 (260') shown in FIG. 4, the operator can, e.g., pull out the spring loaded locking pin 384 and move the shutter flip knob 360 ninety degrees to the other locking hole (not shown) to close the shutter 346 and seat it with the shutter plate 340, with the beveled edges 344, 348 respectively on the shutter 346 and the shutter plate 340 sealing the adjacent portion of the BDU 20 while work is done on the portion isolated by the shutter(s). It will also be understood that the shutter unit 330 may be placed to have a higher pressure on the side of the shutter recess 336 in order to assist in seating the shutter 346 against the shutter plate 340, e.g., if the BDU 20 is normally under pressure, the recess could face the pressurized portion of the BDU 20 while, e.g., maintenance is done on an adjacent module and if the BDU 20 is normally under a vacuum, vice-versa.

Figure 11A:
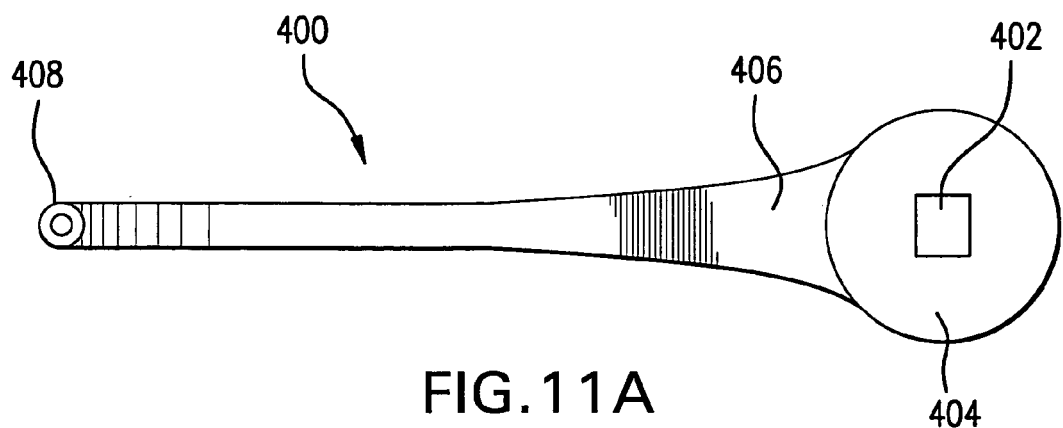
FIGS. 11A and B show a top view and a cross-sectional side view of a tool according to an aspect of an embodiment of the present invention.
Figure 11B:
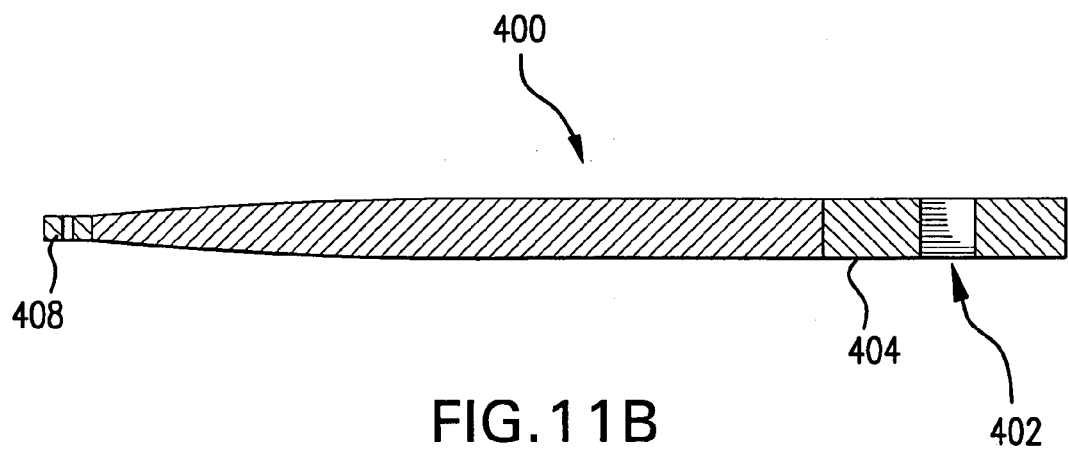

Turning now to FIGS. 11A and B there is shown a top view and a cross-sectional side view of a precision offset ratchet driver 400 according to an aspect of an embodiment of the present invention. This tool has been rendered a necessity due to, e.g., placement of, e.g., allen-type screws and bolts and other like actuators, in, e.g., difficult or almost impossible places to reach within the BDU and its various modules and even interconnections between them. According to an aspect of an embodiment f the present invention the tool 400 can, e.g., enable a user to adjust, e.g., such a screw or bolt or the like in hidden or difficult to reach areas.

The offset ratchet tool 400 can, e.g., be driven using a ratchet driver, e.g., an ordinary socket wrench attachment, which can, e.g., extend into a ratchet opening 404 in a rotatable ratchet spool 404. The spool 404 may be provided with a sprocketed locking mechanism (not shown) of the socket wrench locking feature may be employed. A bit (not shown) may be, e.g., snapped into a rotatable tool chuck 408 at the end of an extension shaft of the tool 400. The too chuck 408 may be driven, e.g., by a continuous cable (not shown) looped around the rotatable chuck 408 and the ratchet spool 404. Tension on this cable may hold the tool 400 together, or other means may be employed to hold the spool 404 and chuck 408 on the extension shaft 406. The cable may pass inside of a hollowed portion f the shaft 408 or in a grooved exterior wall (not shown).

Applicants, according to aspects of an embodiment of the present invention, have established proven materials and design configurations as well as prohibited materials that in conjunction lead to longer optic lifetimes for, e.g., BDUs, e.g., in VUV, DUV and EUV applications. Cleaning processes are also disclosed that enhance optic lifetimes. Such lifetimes are measured, at least in part, by percentage of transmission loss over live, e.g. to 12 pulses and beyond applicants have created a regime that will result in 1% or less loss of transmission in, e.g., the BDU optics over 12 B pulses and above.

Applicants have determined that to achieve the above mentioned objectives for optical lifetimes in, e.g., BDUs that metals for fabrication of the BDU should be exclusively selected from the groups listed below:

Bare metals, i.e., not plated or otherwise finished metals:
Al, Cu, Sn, In, Ni, and alloys of brass, stainless steel and invar.
Metals for Fabrication:
For Enclosures:
6061-T651 al, per ASME SB-209 or SB-211, with conformance certification required;
Others than enclosures (except seals):
Al as defined above and stainless steel type UNS 302 (UNS 30200), UNS 304 (UNS 30400) and 316 L (UNS 31600) per ASTM A276.
Metal finishes:
Surface finishes:
For all purged surfaces, including surfaces exposed to UV—must be at least 32 Ra before plating.
Nickel plating:
Use of Electro-less plating which is denominated by class, depending on thermal treatment applied subsequent to plating, from, e.g., no treatment, treatment for required hardness, non-heat treatable aluminum alloys processed to improve adhesion of the nickel and heat treatable aluminum alloys processed to improve adhesion of the nickel, and according to grade, i.e., thickness of the nickel coatings, e.g., from 0.0010–0.0015", to 0.0005–0.0010" to 0.0015" minimum thickness.
Thin dense chrome plating:
Allowable in pure 99.99% form but not to be used for electrical conductivity.
Welding/soldering:
Welding:
Filler-less, fusion of base metals only.
Soldering:
Flux-less, tin and lead only.
Miscellaneous approved materials:
Glasses:
Pyrex, Fused silica, Schott filter glasses, ultra low expansion ("ULE") glasses and Zerodur.
Crystals:
Calcium fluoride, Magnesium Fluoride, quartz and Sapphire.
Ceramics:
High density (non-porous) ceramics, e.g., Alumina (99% $A_2O_3$), Lucalux, Silicon Nitride and Lead Zirconate Titanate.
VUV foil, e.g., for UV shielding meeting the requirements of all foils being certified UHV foil according to the American Society for Testing and Materials ("ASTM") B479 designation and 3.1.4 and 10.3.1 standards.
Additional materials permitted provided sully shielded from UV light:
Krytox, Teflon and Nylon, and Epoxy, Scott Weld 2216, made by 3M.

Applicants have also discovered that required design practices include the elimination of virtual leaks and features that are difficult to clean. Blind holes, e.g., must be vented or used in conjunction with vented fastener hardware. Fasteners must be precision cleaned nickel plated stainless steel vented fasteners rated to High Vacuum equipment, e.g., as supplied by U-C Components, Inc. or the equivalent. Design features that are prone to trapping particulate contamination are to be avoided if at all possible, including, e.g., blind holes, rough surfaces, surface interfaces that can propagate liquids, rivets, etc. Particular attention must be provided to such elements as optical mounts and translation stages/mechanisms for which lubricants and other disallowed materials are not permitted.

The BDU must also be free of purge volume dead zones, i.e., the elimination to the greatest extent possible of volumes where air/purge gas may become trapped and not circulated.

All fabricated parts must also be cleaned for VUV applications using a precision cleaning process prior to assembly. Verification of the details of the cleaning procedure must be provided and obtained before assembly. A precision cleaning process meeting the requirements of must be used, such that contamination (unwanted material) is minimized to prevent interference with proper operations, which is more stringent than just visually clean (absent all particulate and non-particulate matter visible to the unaided eye and/or corrected vision), and is required to any "significant surface" which means any surface of an item or product that is required to meet established cleanliness levels, and establishes maximum amounts of contamination allowable, either by area or volume or per component. Precision cleanliness levels are required, meaning that levels may be described as "quantitative," since particulate counts, with or without nonvolatile residue ("NVR") or other suitable film/non-particulate method limits may be required.

All fabrication process cycles must be performed under control procedures suitable for VUV opto-mechanical parts fabrication meeting the requirements of acceptable processes and materials such that cleanliness standards are met; packaging requirements to, e.g., preserve such cleanliness requirements; and maintain inspection and detection minimums to preserve such cleanliness and also tests to, e.g., measure and determine out-gassing and the like.

It will be understood by those skilled in the art that many variations and modifications of the above described preferred embodiment(s) of the present invention and aspects thereof can be made without departing from the scope and intent of the appended claims and the invention should be interpreted in scope and meaning only from the appended claims and not limited to any particular preferred embodiment (s) or aspect thereof. For example, purging can be accomplished with a pressurized system, e.g., with an inert gas like $N_2$ or a vacuum system, or combinations thereof in different modules that may be isolated from each other by a pressure resistant interface, e.g., an optical element, and the term purged shall be interpreted to include, e.g., either such pressurized or vacuum arrangements.

We claim:
1. A beam delivery unit comprising:
a beam delivery enclosure defining an output laser light pulse beam delivery path from an output of a gas discharge laser to an input of a working apparatus employing the light contained in the output laser light pulse beam;
a purge mechanism operatively connected to the beam delivery enclosure;

an in-situ beam parameter monitor and adjustment mechanism within the enclosure, comprising a retractable beam redirecting optic;
a retraction screw operable from outside of the enclosure to move the retractable beam redirecting optic,
a beam analysis mechanism external to the enclosure; and,
a retraction mechanism within the enclosure and operable from outside the enclosure and operative to move the retractable beam redirecting optic from a retracted position out of the beam path to an operative position in the beam path.

2. The apparatus of claim 1 further comprising:
the retractable beam redirecting optic comprises a prism.

3. The apparatus of claim 2 further comprising:
a retraction alignment mechanism.

4. The apparatus of claim 3 further comprising:
a retraction screw operable from outside of the enclosure to move the retractable beam redirecting optic.

5. The apparatus of claim 3 further comprising:
the retraction alignment mechanism comprising at least one alignment post slideably engaging a prism mounting assembly mount through an alignment opening.

6. The apparatus of claim 2 further comprising:
a retraction screw operable from outside of the enclosure to move the retractable beam redirecting optic.

7. A beam delivery unit comprising:
a beam delivery enclosure defining an output laser light pulse beam delivery path from an output of a gas discharge laser to an input of a working apparatus employing the light contained in the output laser light pulse beam;
a purge mechanism operatively connected to the beam delivery enclosure;
at least one optic module;
at least two enclosure isolation mechanisms comprising a first enclosure isolation mechanism on a first side of the enclosure from the at least one optic module and a second enclosure isolation mechanism on a second side of die enclosure from the at least one optic module;
each respective enclosure isolation mechanism comprising a flapper valve having a metal to metal seating mechanism and a locking pin assembly.

8. The apparatus of claim 7 further comprising:
a flip lock knob operatively connected to a shaft operatively connected to the flapper valve and having at least a first locked position and a second locked position.

9. The apparatus of claim 8 further comprising:
the flip lock knob comprising a detent operatively positionable by a spring loaded locking pin in a first or a second detent receiving opening on a flip lock knob mounting plate.

10. A beam delivery unit comprising:
a beam delivery enclosure defining an output laser light pulse beam delivery path from an output of a gas discharge laser to an input of a working apparatus employing the light contained in the output laser light pulse beam;
a purge mechanism operatively connected to the beam delivery enclosure;
an external kinematic alignment tool; and
the external kinematic alignment tool comprises a mounting place comprising an alignment adjustable tool platform; and,
a tool mounted on the adjustable tool platform according to a calibrated alignment of the alignment adjustable tool platform with respect to the mounting plate.

* * * * *